(12) United States Patent
Shimizu et al.

(10) Patent No.: US 12,542,536 B2
(45) Date of Patent: Feb. 3, 2026

(54) COMPOSITE FILTER DEVICE

(71) Applicant: Murata Manufacturing Co., Ltd., Nagaokakyo (JP)

(72) Inventors: Yasuhiro Shimizu, Nagaokakyo (JP); Sunao Yamazaki, Nagaokakyo (JP); Kenta Maeda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 204 days.

(21) Appl. No.: 18/368,177

(22) Filed: Sep. 14, 2023

(65) Prior Publication Data
US 2024/0097653 A1    Mar. 21, 2024

(30) Foreign Application Priority Data
Sep. 16, 2022 (JP) .................. 2022-147652

(51) Int. Cl.
*H03H 9/64* (2006.01)
*H03H 9/02* (2006.01)
*H03H 9/10* (2006.01)

(52) U.S. Cl.
CPC ...... *H03H 9/6483* (2013.01); *H03H 9/02574* (2013.01); *H03H 9/1064* (2013.01); *H03H 9/6453* (2013.01)

(58) Field of Classification Search
CPC ............. H03H 9/6483; H03H 9/02574; H03H 9/1064; H03H 9/6453; H03H 9/02913; H03H 9/02952; H03H 9/0547
See application file for complete search history.

(56) References Cited

U.S. PATENT DOCUMENTS

| 10,396,757 B2* | 8/2019 | Kakita | H01L 23/53242 |
| 11,206,008 B2* | 12/2021 | Dogiamis | H03H 9/10 |
| 2007/0115079 A1* | 5/2007 | Kubo | H03H 9/564 |
| | | | 333/189 |
| 2022/0158612 A1* | 5/2022 | Goto | H03H 9/0561 |

FOREIGN PATENT DOCUMENTS

JP    2015-091605 A    5/2015

* cited by examiner

*Primary Examiner* — John W Poos
(74) *Attorney, Agent, or Firm* — Keating & Bennett, LLP

(57) ABSTRACT

In a composite filter device, a first acoustic wave resonator includes a functional electrode on a first main surface of a first piezoelectric substrate, and a wiring electrode is on the first main surface and is not connected to a signal potential. A support is on the first main surface and surrounds the first acoustic wave resonator. A second piezoelectric substrate is on the support and includes a third main surface closer to the support than a fourth main surface. A second acoustic wave resonator includes a functional electrode on the third main surface. The second acoustic wave resonator is a parallel-arm resonator higher in resonant frequency than any other parallel-arm resonator or a series-arm resonator lower in resonant frequency than any other series-arm resonator. The second acoustic wave resonator and the wiring electrode overlap each other when viewed in plan.

20 Claims, 7 Drawing Sheets

COMPOSITE FILTER DEVICE

CROSS REFERENCE TO RELATED APPLICATIONS

This application claims the benefit of priority to Japanese Patent Application No. 2022-147652 filed on Sep. 16, 2022. The entire contents of this application are hereby incorporated herein by reference.

BACKGROUND OF THE INVENTION

1. Field of the Invention

The present invention relates to a composite filter device including acoustic wave resonators.

2. Description of the Related Art

Composite filter devices each including acoustic wave resonators have been used as filters in a wide range of applications such as mobile phones. An electronic component is described in Japanese Unexamined Patent Application Publication No. 2015-091605 as an example of the composite filter devices. Specifically, the electronic component described as an example of the composite filter devices is a duplexer. The duplexer includes a pair of piezoelectric substrates that are bonded together with an adhesive layer disposed therebetween. A clearance is left between the piezoelectric substrates. The piezoelectric substrates are each provided with an interdigital transducer (IDT). The IDTs are disposed on main surfaces of the respective piezoelectric substrates and located in the clearance.

It is required that the attenuation of filters constituting the composite filter device be sufficiently steep in the vicinity of the boundary on the high-frequency side or on the low-frequency side of the passband. Such a filter with a sufficiently steep attenuation can further ensure that unwanted signals of frequencies close to the passband of the filter are kept from passing through the filter. For increased steepness of the attenuation, the filter may include capacitive elements connected in parallel to the resonators.

In regard to the composite filter device described in Japanese Unexamined Patent Application Publication No. 2015-091605, it is required that a mounting place for capacitive elements be provided on each of the piezoelectric substrates so that the capacitive elements can be connected in parallel to the resonators. Consequently, the degree of flexibility in the layout of the resonators on the piezoelectric substrates can be reduced.

SUMMARY OF THE INVENTION

Preferred embodiments of the present invention provide composite filter devices each designed to increase the steepness of the attenuation slope relevant to the filter characteristics without decreasing the degree of flexibility in the layout of resonators.

A composite filter device according to a preferred embodiment of the present invention includes a first filter and a second filter each including at least one series-arm resonator and at least one parallel-arm resonator. The composite filter device includes a first piezoelectric substrate, a first acoustic wave resonator, a wiring electrode, a support, a second piezoelectric substrate, and a second acoustic wave resonator. The first piezoelectric substrate includes a first main surface and a second main surface on opposite sides. The first acoustic wave resonator includes a functional electrode on the first main surface of the first piezoelectric substrate. The first acoustic wave resonator is included in the first filter. The wiring electrode is on the first main surface of the first piezoelectric substrate. The wiring electrode is not connected to a signal potential. The support is on the first main surface of the first piezoelectric substrate and surrounds the first acoustic wave resonator. The second piezoelectric substrate is on the support and includes a third main surface and a fourth main surface on opposite sides. The third main surface is closer than the fourth main surface to the support. The second acoustic wave resonator includes a functional electrode on the third main surface of the second piezoelectric substrate. The second acoustic wave resonator is included in the second filter. The first acoustic wave resonator and the second acoustic wave resonator are located in a space defined by the first main surface of the first piezoelectric substrate, the third main surface of the second piezoelectric substrate, and the support. The second acoustic wave resonator is a parallel-arm resonator higher in resonant frequency than any other parallel-arm resonator of the second filter or a series-arm resonator lower in resonant frequency than any other series-arm resonator of the second filter. The second acoustic wave resonator and the wiring electrode overlap each other when viewed in plan.

The steepness of the attenuation slope relevant to the filter characteristics of the composite filter devices according to preferred embodiments of the present invention can be increased without decreasing the degree of flexibility in the layout of the resonators.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention is clarified by way of preferred embodiments, which are described below with reference to the accompanying drawings.

It should be noted that the preferred embodiments described herein are illustrative examples, and partial replacements or combinations of configurations illustrated in different preferred embodiments are possible.

Figure 1:
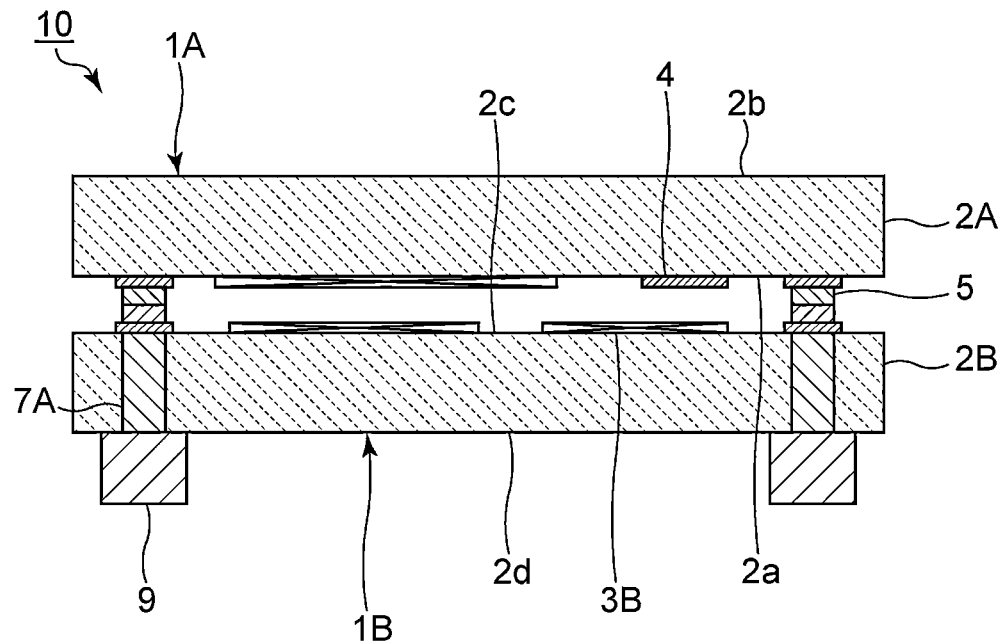
FIG. 1 is a sectional view of a composite filter device according to a first preferred embodiment of the present invention, schematically illustrating the composite filter device viewed from the front.

FIG. 1 is a sectional view of a composite filter device according to a first preferred embodiment of the present invention, schematically illustrating the composite filter device viewed from the front. Resonators in FIG. 1 are each indicated in simplified form by a rectangle with two diagonal lines. The same holds true for the other accompanying drawings including schematic sectional views and schematic plan views.

A composite filter device 10 includes a first filter 1A and a second filter 1B. The first filter 1A and the second filter 1B are ladder filters. This means that the first filter 1A and the second filter 1B each include at least one series-arm resonator and at least one parallel-arm resonator. Specifically, acoustic wave resonators are included as the series-arm resonators and the parallel-arm resonators in the first filter 1A and the second filter 1B in the present preferred embodiment. The first filter 1A and the second filter 1B each may be a transmitting filter or a receiving filter. The configuration of the composite filter device 10 is described below in a concrete manner.

The composite filter device 10 includes a first piezoelectric substrate 2A. The first piezoelectric substrate 2A is made of a piezoelectric material only. The first piezoelectric substrate 2A includes a first main surface 2a and a second main surface 2b. The first main surface 2a and the second main surface 2b are located on opposite sides. The first piezoelectric substrate 2A may be a multilayer substrate including piezoelectric layers.

Figure 2:
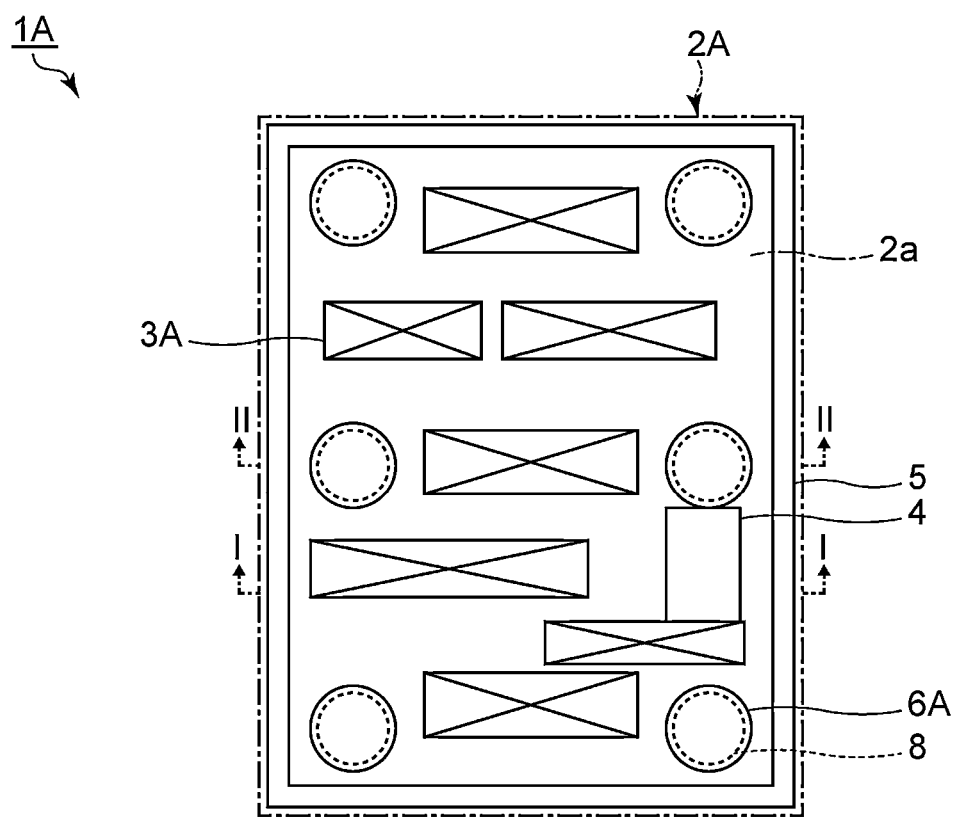
FIG. 2 is a plan perspective view of a first piezoelectric substrate in the first preferred embodiment of the present invention, schematically illustrating the electrode configuration on the first piezoelectric substrate.

FIG. 2 is a plan perspective view of the first piezoelectric substrate in the first preferred embodiment, schematically illustrating the electrode configuration on the first piezoelectric substrate. Wiring other than wiring electrodes, which will be described later, is not illustrated in FIG. 2. The same holds true for the other schematic plan views in the accompanying drawings.

The first piezoelectric substrate 2A is provided with acoustic wave resonators. Specifically, functional electrodes are disposed on the first main surface 2a of the first piezoelectric substrate 2A. The functional electrodes are included in the respective acoustic wave resonators. The functional electrodes on the first piezoelectric substrate 2A in the present preferred embodiment are IDT electrodes. The acoustic wave resonators on the first piezoelectric substrate 2A include more than one series-arm resonator and more than one parallel-arm resonator. The acoustic wave resonators define the first filter 1A. One of the acoustic wave resonators included in the first filter 1A is a first acoustic wave resonator 3A. The first acoustic wave resonator 3A may be a series-arm resonator or a parallel-arm resonator.

A wiring electrode 4 is disposed on the first main surface 2a of the first piezoelectric substrate 2A. The wiring electrode 4 is connected to the reference potential. The wiring electrode 4 in the present preferred embodiment is connected to one of the parallel-arm resonators. In some preferred embodiments, however, the wiring electrode 4 is not connected to the parallel-arm resonator.

A support 5 is disposed on the first main surface 2a of the first piezoelectric substrate 2A. The support 5 surrounds the acoustic wave resonators on the first piezoelectric substrate 2A. Specifically, the support 5 surrounds the functional electrodes disposed on the first main surface 2a. The support 5 in the present preferred embodiment is in the form of a frame. In some preferred embodiments, however, the acoustic wave resonators may be surrounded by columnar supports arranged on the first main surface 2a.

Referring back to FIG. 1, a second piezoelectric substrate 2B is disposed on the support 5. The second piezoelectric substrate 2B is made of a piezoelectric material only. The second piezoelectric substrate 2B includes a third main surface 2c and a fourth main surface 2d. The third main surface 2c and the fourth main surface 2d are located on opposite sides. The second piezoelectric substrate 2B may be a multilayer substrate including piezoelectric layers.

Figure 3:
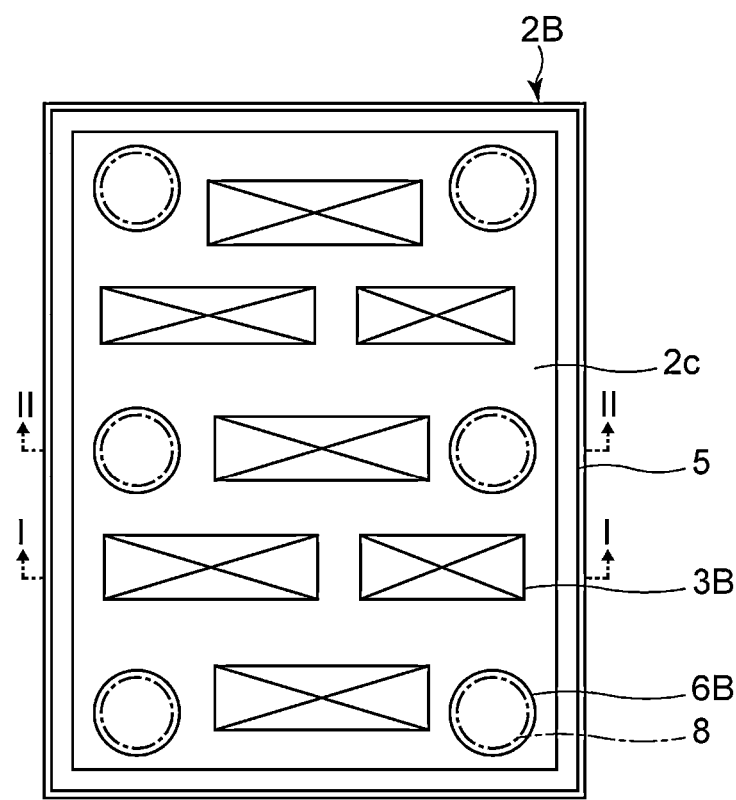
FIG. 3 is a plan view of a second piezoelectric substrate in the first preferred embodiment of the present invention, schematically illustrating the electrode configuration on the second piezoelectric substrate.
Figure 4:
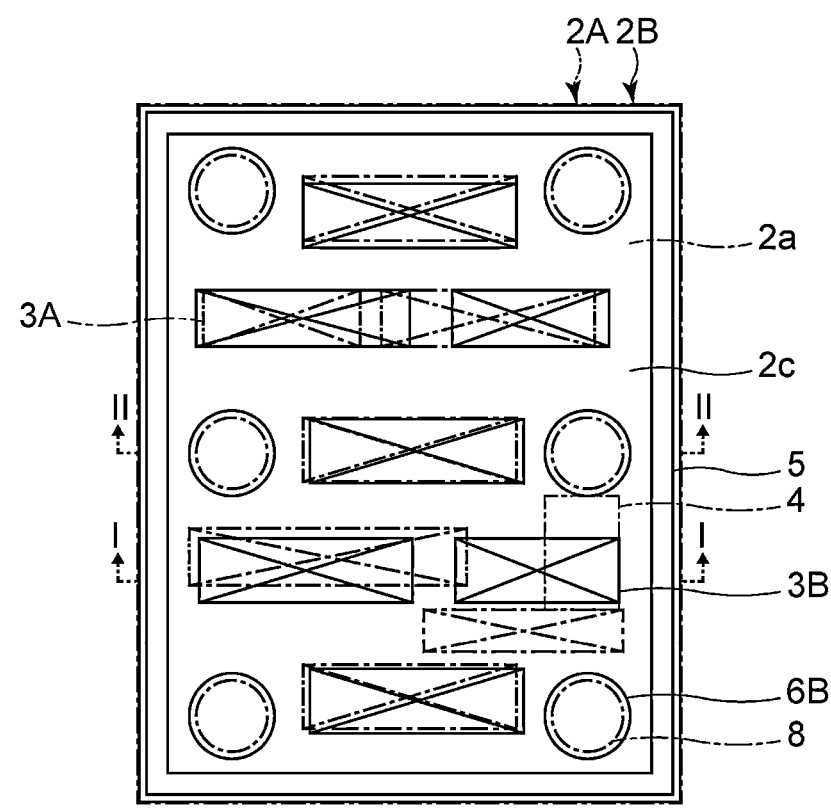
FIG. 4 is a plan perspective view of the first and second piezoelectric substrates in the first preferred embodiment of the present invention, schematically illustrating the electrode configuration on the first piezoelectric substrate and the electrode configuration on the second piezoelectric substrate.

FIG. 3 is a plan view of the second piezoelectric substrate in the first preferred embodiment, schematically illustrating the electrode configuration on the second piezoelectric substrate. FIG. 4 is a plan perspective view of the first and second piezoelectric substrates in the first preferred embodiment, schematically illustrating the electrode configuration on the first piezoelectric substrate and the electrode configuration on the second piezoelectric substrate. FIG. 1 is a schematic sectional view of the composite filter device taken along line I-I in FIGS. 2, 3, and 4.

As illustrated in FIG. 3, the second piezoelectric substrate 2B is provided with acoustic wave resonators. Specifically, functional electrodes are disposed on the third main surface 2c of the second piezoelectric substrate 2B. The functional electrodes are included in the respective acoustic wave resonators. The functional electrodes on the second piezoelectric substrate 2B in the present preferred embodiment are IDT electrodes. The acoustic wave resonators on the second piezoelectric substrate 2B include more than one series-arm resonator and more than one parallel-arm resonator. The acoustic wave resonators define the second filter 1B. One of the acoustic wave resonators included in the second filter 1B is a second acoustic wave resonator 3B.

Some of the unique features of the present preferred embodiment are as follows: the second acoustic wave resonator 3B is a parallel-arm resonator higher in resonant frequency than any other parallel-arm resonator of the second filter 1B, and the second acoustic wave resonator 3B and the wiring electrode 4 overlap each other when viewed in plan, as illustrated in FIG. 4. In some preferred embodiments, however, the second acoustic wave resonator 3B is a series-arm resonator lower in resonant frequency than any other series-arm resonator of the second filter 1B. The steepness of attenuation of the composite filter device 10 configured as described above can be increased without a decrease in the degree of flexibility in the layout of the resonators, as will be elaborated below.

The expression "viewed in plan" herein means that the composite filter device 10 is viewed from the upper side in FIG. 1. Referring to FIG. 1, the first piezoelectric substrate 2A is closer than the second piezoelectric substrate 2B to the upper side. The expression "steep attenuation" herein refers to the state in which the amount of change in frequency relative to a certain amount of change in attenuation is small in the vicinity of the boundary of the passband.

The second filter 1B is a ladder filter, the passband of which is dependent on the anti-resonant frequencies of the parallel-arm resonators. The anti-resonant frequencies of the parallel-arm resonators are within the passband of the filter. The resonant frequencies of the parallel-arm resonators are on the low-frequency side relative to the passband. The higher the resonant frequency of a parallel-arm resonator is, the closer the resonant frequency of the parallel-arm resonator is to the passband of the ladder filter. Thus, a parallel-arm resonator higher in resonant frequency than any other parallel-arm resonator of the ladder filter can heavily influence the steepness of the attenuation slope relevant to the filter characteristics. When there is little difference between the resonant frequency and the anti-resonant frequency of the parallel-arm resonator, the attenuation slope of the filter is steep in the vicinity of the boundary on the low-frequency side of the passband.

When capacitive portions are connected in parallel to an acoustic wave resonator such as a parallel-arm resonator, the electrostatic capacitance of the capacitive portion is provided to the acoustic wave resonator. Accordingly, the difference between the resonant frequency and the anti-resonant frequency of the parallel-arm resonator is reduced. The second acoustic wave resonator 3B and the wiring electrode 4 in the present preferred embodiment overlap each other when viewed in plan. This means that the second acoustic wave resonator 3B and the wiring electrode 4 face each other, as illustrated in FIG. 1. The circuit configuration of the second filter 1B can thus be equated with a circuit in which capacitive portions are connected in parallel to the second acoustic wave resonator 3B.

Figure 5:
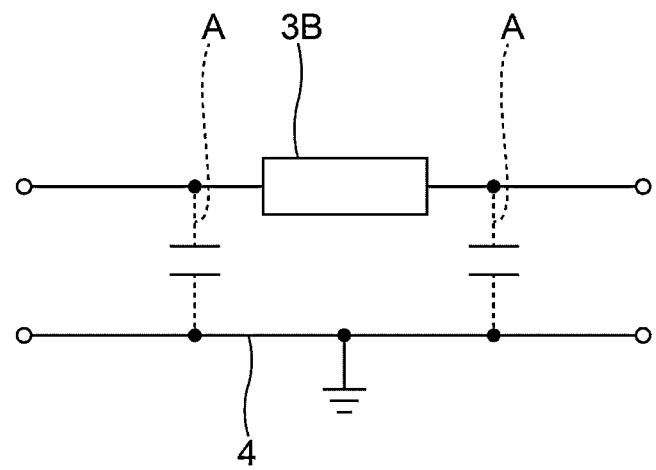
FIG. 5 is a schematic circuit diagram of an equivalent circuit including a second acoustic wave resonator in the first preferred embodiment of the present invention.

FIG. 5 is a schematic circuit diagram of an equivalent circuit including the second acoustic wave resonator in the first preferred embodiment.

As mentioned above, the second acoustic wave resonator 3B and the wiring electrode 4 face each other. For this reason, capacitive coupling, which is indicted by broken lines A, is provided between the second acoustic wave resonator 3B and the wiring electrode 4. More specifically, capacitive coupling is provided on both the high-potential side and the low-potential side of the second acoustic wave resonator 3B. The circuit configuration of the second filter 1B can thus be equated with a circuit in which capacitive portions are connected in parallel to the second acoustic wave resonator 3B. This means that the electrostatic capacitance is provided to the second acoustic wave resonator 3B. Accordingly, the difference between the resonant frequency and the anti-resonant frequency of the second acoustic wave resonator 3B is reduced. This will be discussed on the basis of a comparison of the impedance-frequency characteristics in the present preferred embodiment to the impedance-frequency characteristics in a comparative example. The second acoustic wave resonator 3B and the wiring electrode 4 in the present preferred embodiment face each other, whereas the second acoustic wave resonator 3B and the wiring electrode 4 in the comparative example do not face each other.

Figure 6:
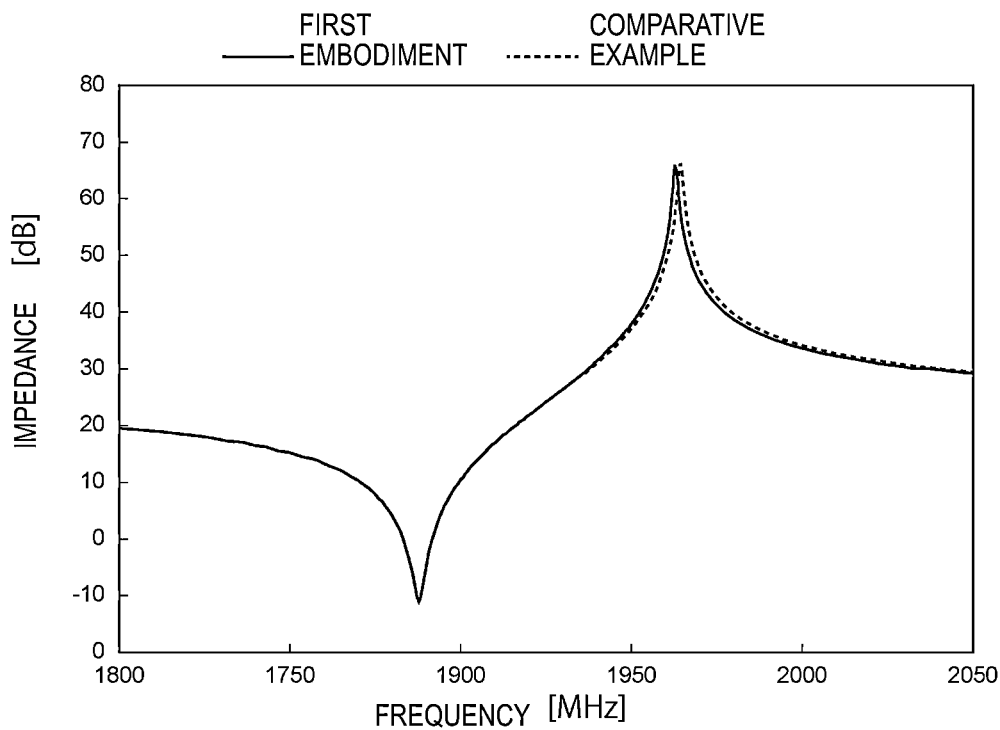
FIG. 6 illustrates the impedance-frequency characteristics of the second acoustic wave resonator in the first preferred embodiment of the present invention and the impedance-frequency characteristics of a second acoustic wave resonator in a comparative example.

FIG. 6 illustrates the impedance-frequency characteristics of the second acoustic wave resonator in the first preferred embodiment of the present invention and the impedance-frequency characteristics of the second acoustic wave resonator in the comparative example.

As can be seen in FIG. 6, the difference between the resonant frequency and the anti-resonant frequency of the second acoustic wave resonator 3B is smaller in the first preferred embodiment than in the comparative example. The second acoustic wave resonator 3B is a parallel-arm resonator higher in resonant frequency than any other parallel-arm resonator of the second filter 1B. This yields an increase in the steepness of attenuation in the vicinity of the boundary on the low-frequency side of the passband of the second filter 1B in the first preferred embodiment.

As illustrated in FIG. 2, the wiring electrode 4 may be used to connect the parallel-arm resonators of the first filter 1A to the reference potential. Thus, the circuit configuration of the second filter 1B in the first preferred embodiment can be equated with a circuit in which capacitive portions are connected in parallel to the second acoustic wave resonator 3B, without the need for wiring dedicated to the capacitive portions. Accordingly, the steepness of the attenuation slope relevant to the filter characteristics can be increased without a decrease in the degree of flexibility in the layout of the resonators.

The following describes the present preferred embodiment in more detail.

Figure 7:
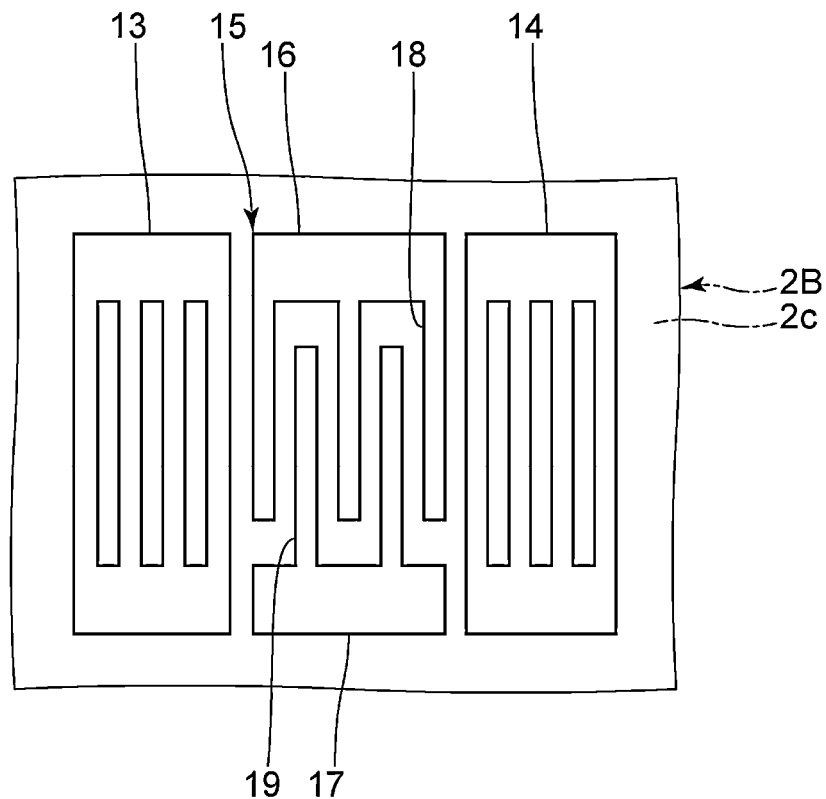
FIG. 7 is a plan perspective view of the second acoustic wave resonator in a preferred embodiment of the present invention, illustrating the electrode configuration of the second acoustic wave resonator.

FIG. 7 is a plan perspective view of the second acoustic wave resonator, illustrating the electrode configuration of the second acoustic wave resonator.

The second acoustic wave resonator 3B is a parallel-arm resonator including an IDT electrode 15 and a pair of resonators, namely, a reflector 13 and a reflector 14. The IDT electrode 15, the reflector 13, and the reflector 14 are disposed on the third main surface 2c of the second piezoelectric substrate 2B.

The IDT electrode 15 includes a pair of busbars and multiple electrode fingers. Specifically, a first busbar 16 and a second busbar 17 are paired with each other. The first busbar 16 and the second busbar 17 face each other. The electrode fingers include first electrode fingers 18 and second electrode fingers 19. The first electrode fingers 18 each include an end connected to the first busbar 16. The second electrode fingers 19 each include an end connected to the second busbar 17. The first electrode fingers 18 interdigitate with the second electrode fingers 19. The array of the first electrode fingers 18 and the array of the second electrode fingers 19 are connected to different potentials.

The first electrode fingers 18 and the second electrode fingers 19 may be hereinafter also simply referred to as electrode fingers. The direction in which the electrode fingers of the IDT electrode 15 protrude is hereinafter referred to as an electrode finger protrusion direction. The reflectors paired with each other are located on opposite sides in a direction orthogonal to the electrode finger protrusion direction and face each other with the IDT electrode 15 disposed therebetween. Upon application of an alternating voltage to the IDT electrode 15, an acoustic wave is excited. The acoustic wave propagates in a direction orthogonal to the electrode finger protrusion direction in the present preferred embodiment.

The parallel-arm resonators and the series-arm resonators of the first filter 1A and the parallel-arm resonators and the series-arm resonators of the second filter 1B other than the second acoustic wave resonator 3B are similar to the second acoustic wave resonator 3B. That is, the resonators each include an IDT electrode and a pair of reflectors. Specifically, surface acoustic wave resonators are included as the series-arm resonators and the parallel-arm resonators in the first filter 1A and the second filter 1B. The parallel-arm resonators and the series-arm resonators of the second filter 1B share the second piezoelectric substrate 2B. The parallel-arm resonators and the series-arm resonators of the first filter 1A share the first piezoelectric substrate 2A.

Referring to FIG. 4, the wiring electrode 4 in the present preferred embodiment overlap the pair of busbars of the second acoustic wave resonator 3B when viewed in plan. This layout reliably ensures that increased electrostatic capacitance is provided to the second acoustic wave resonator 3B. Accordingly, the steepness of the attenuation slope relevant to the filter characteristics can be increased with a high degree of reliability and effectiveness. This effect can be produced when the wiring electrode 4 extends over at least a portion of the second acoustic wave resonator 3B viewed in plan.

Referring to FIG. 1, through-via electrodes 7A extend through the second piezoelectric substrate 2B. One end of each of the through-via electrodes 7A is connected to the support 5. The support 5 is a multilayer body including metal layers. Thus, the support 5 is electrically connected to the through-via electrodes 7A. The other end of each of the through-via electrodes 7A is joined to a bump 9.

The support 5 is connected with one or more of the acoustic wave resonators of the first filter 1A or one or more of the acoustic wave resonators of the second filter 1B, although the connection is not illustrated in the drawings. That is, one or more of the acoustic wave resonators of the first filter 1A or one or more of the acoustic wave resonators of the second filter 1B are electrically connected to the outside by the support 5, the through-via electrodes 7A, and the bumps 9. It is not required that the support 5 be electrically connected to the acoustic wave resonators.

Referring to FIG. 2, first electrode pads 6A are disposed on the first main surface 2a of the first piezoelectric substrate 2A. The first electrode pads 6A are surrounded by the support 5 when viewed in plan. The first electrode pads 6A are electrically connected with the acoustic wave resonators of the first filter 1A, although the electrical connection is not illustrated in the drawings. It is not required that all of the first electrode pads 6A be electrically connected to the acoustic wave resonators.

Referring to FIG. 3, second electrode pads 6B are disposed on the third main surface 2c of the second piezoelectric substrate 2B. The second electrode pads 6B are surrounded by the support 5 when viewed in plan. The second electrode pads 6B are electrically connected with the acoustic wave resonators of the second filter 1B, although the electrical connection is not illustrated in the drawings. It is not required that all of the second electrode pads 6B be electrically connected to the acoustic wave resonators.

Figure 8:
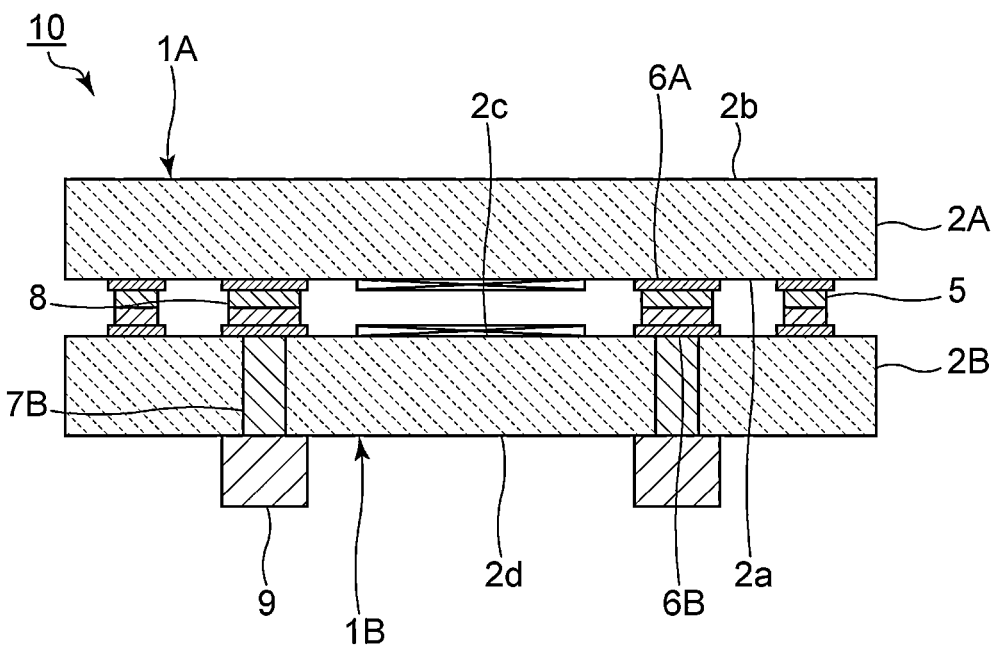
FIG. 8 is a schematic sectional view of the composite filter device taken along line II-II in FIG. 2.

FIG. 8 is a schematic sectional view of the composite filter device taken along line II-II in FIG. 2.

The composite filter device 10 includes columnar members 8. The first piezoelectric substrate 2A and the second piezoelectric substrate 2B are supported by the columnar members 8 as well as by the support 5. One end of each of the columnar members 8 is connected to the corresponding one of the first electrode pads 6A on the first piezoelectric substrate 2A. The other end of each of the columnar members 8 is connected to the corresponding one of the second electrode pads 6B on the second piezoelectric substrate 2B. Each of the columnar members 8 is a multilayer body including metal layers. Thus, the columnar members 8 define an electrical connection between the first electrode pads 6A and the second electrode pads 6B.

Through-via electrodes 7B extend through the second piezoelectric substrate 2B. One end of each of the through-via electrodes 7B is connected to the corresponding one of the second electrode pads 6B. The other end of each of the through-via electrodes 7B is joined to a bump 9.

As mentioned above, one or more of the first electrode pads 6A are connected to the acoustic wave resonators of the first filter 1A. Likewise, one or more of the second electrode pads 6B are connected to the acoustic wave resonators of the second filter 1B. That is, one or more of the acoustic wave resonators of the first filter 1A and one or more of the acoustic wave resonators of the second filter 1B are electrically connected to the outside by the columnar members 8, the through-via electrodes 7B, and the bumps 9.

The through-via electrodes 7B may extend through the first piezoelectric substrate 2A instead of extending through the second piezoelectric substrate 2B. Likewise, the through-via electrodes 7A (see FIG. 1) may extend through the first piezoelectric substrate 2A instead of extending through the second piezoelectric substrate 2B. In this case, the second acoustic wave resonator 3B on the third main surface 2c of the second piezoelectric substrate 2B and the wiring electrode 4 may overlap each other when viewed in plan.

As described above in relation to the first preferred embodiment, the wiring electrode 4 is preferably connected to the reference potential. The reason is that unwanted signals transmitted from the second acoustic wave resonator 3B through the capacitive coupling can be transferred to the reference potential side on the outside via the wiring electrode 4 connected to the reference potential. This reduces the possibility that the attenuation characteristics will deteriorate.

The wiring electrode 4 may be a floating electrode. The term "floating electrode" herein refers to an electrode connected to neither the signal potential nor the reference potential.

As mentioned above, the first piezoelectric substrate 2A and the second piezoelectric substrate 2B are each made of a piezoelectric material only. Examples of the piezoelectric material include lithium niobate, lithium tantalate, zinc oxide, aluminum nitride, quartz, and PZT (lead zirconate titanate).

Figure 9:
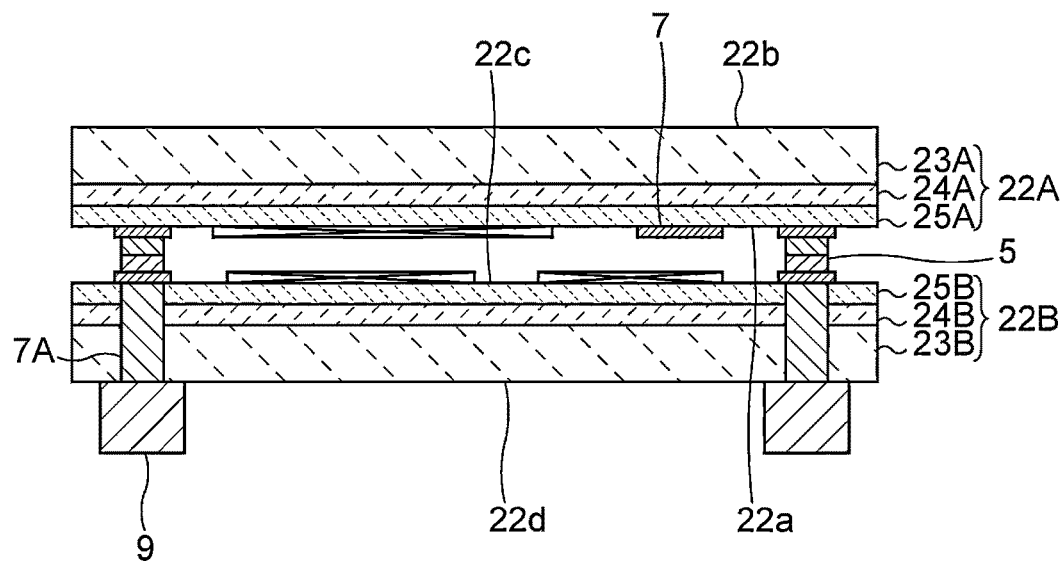
FIG. 9 is a sectional view of a composite filter device according to a modification of the first preferred embodiment of the present invention, schematically illustrating the composite filter device viewed from the front.

Alternatively, the first piezoelectric substrate 2A and the second piezoelectric substrate 2B each may be a multilayer substrate including piezoelectric layers. For example, a first piezoelectric substrate 22A in a modification of the first preferred embodiment includes a first support substrate 23A, a first interlayer 24A, and a first piezoelectric layer 25A (see FIG. 9). The first interlayer 24A is disposed on the first support substrate 23A. The first piezoelectric layer 25A is disposed on the first interlayer 24A.

The first piezoelectric substrate 22A includes a first main surface 22a, which is closer than any other portion of the first piezoelectric substrate 22A to a second piezoelectric substrate 22B. The first main surface 22a in this modification is a main surface of the first piezoelectric layer 25A. The main surface of the first piezoelectric layer 25A may be a portion of the first main surface 22a. For example, the first main surface 22a may include a main surface of the first interlayer 24A or a main surface of the first support substrate 23A, as well as the main surface of the first piezoelectric layer 25A.

The first piezoelectric substrate 22A includes a second main surface 22b, which is on an opposite side from the first main surface 22a and is the outermost surface of the first piezoelectric substrate 22A. The second main surface 22b in this modification is a main surface of the first support substrate 23A and is farther than any other portion of the first piezoelectric substrate 22A from the inner side.

The second piezoelectric substrate 22B, which is structurally similar to the first piezoelectric substrate 22A, is a multilayer substrate including a second support substrate 23B, a second interlayer 24B, and a second piezoelectric substrate 25B. The second piezoelectric substrate 22B includes a third main surface 22c, which is closer than any other portion of the second piezoelectric substrate 22B to the first piezoelectric substrate 22A. The third main surface 22c in this modification is a main surface of the second piezoelectric layer 25B. The main surface of the second piezoelectric layer 25B may be a portion of the third main surface 22c. For example, the third main surface 22c may include a main surface of the second interlayer 24B or a main surface of the second support substrate 23B, as well as the main surface of the second piezoelectric layer 25B.

The second piezoelectric substrate 22B includes a fourth main surface 22d, which is on an opposite side from the third main surface 22c and is the outermost surface of the second piezoelectric substrate 22B. The fourth main surface 22d in this modification is a main surface of the second support substrate 23B and is farther than any other portion of the second piezoelectric substrate 22B from the inner side.

The first support substrate 23A and the second support substrate 23B may be made of a semiconductor material, such as silicon or may be made of a ceramic material, such as aluminum oxide. The first interlayer 24A and the second interlayer 24B may be made of a dielectric material, such as silicon oxide, silicon nitride, or tantalum oxide. The first interlayer 24A and the second interlayer 24B each may be a multilayer body including dielectric layers. Examples of the material of the first piezoelectric layer 25A and the second piezoelectric layer 25B include those mentioned above as the examples of the material of the first piezoelectric substrate 2A and the second piezoelectric substrate 2B in the first preferred embodiment.

The first filter and the second filter each may include a longitudinally coupled resonator-type acoustic wave filter. In this case, the longitudinally coupled resonator-type acoustic wave filters may be electrically connected with series-arm resonators and parallel-arm resonators. The first filter and the second filter in a preferred embodiment of the present invention each include at least one series-arm resonator and at least one parallel-arm resonator.

Referring back to FIG. 1, all of the acoustic wave resonators of the first filter 1A in the first preferred embodiment are disposed on the first piezoelectric substrate 2A, and all of the acoustic wave resonators of the second filter 1B in the first preferred embodiment are disposed on the second piezoelectric substrate 2B. In some preferred embodiments of the present invention, one or more of the acoustic wave resonators of the first filter 1A may be disposed on the second piezoelectric substrate, and one or more of the acoustic wave resonators of the second filter may be disposed on the first piezoelectric substrate.

The resonant frequencies of surface acoustic wave resonators may be compared with each other on the basis of the electrode finger pitch and the metallization ratio. The electrode finger pitch is the distance between adjacent electrode fingers in the propagation direction of an acoustic wave or, more specifically, the distance between the center lines of the electrode fingers adjacent to each other and connected to different potentials. For example, the number that is the inverse of the result of multiplying the electrode finger pitch by the metallization ratio may be used as an indicator for comparison between the resonant frequencies of two surface acoustic wave resonators including electrode fingers of the same thickness, because the higher the resonant frequency is, the greater the number is.

The second acoustic wave resonator 3B preferably tops all of the other parallel-arm resonators of the second filter 1B in terms of the number that is the inverse of the result of multiplying the electrode finger pitch of the IDT electrode 15 by the metallization ratio. This feature more reliably ensures that the second acoustic wave resonator 3B is higher in resonant frequency than any other parallel-arm resonator of the second filter 1B.

A dielectric film that covers the IDT electrodes of the acoustic wave resonators on the first main surface 2a of the first piezoelectric substrate 2A may be provided so that the acoustic wave resonators of the first filter 1A are less prone to breakage. Likewise, a dielectric film that covers the IDT electrodes of the acoustic wave resonators on the third main surface 2c of the second piezoelectric substrate 2B may be provided so that the acoustic wave resonators of the second filter 1B are less prone to breakage. Such a dielectric film that covers the functional electrodes on the first surface or the functional electrodes on the third surface may be adopted into preferred embodiments other than the first preferred embodiment of the present invention.

The number that is the inverse of the result of multiplying the electrode finger pitch by the metallization ratio may be used as an indicator for comparison between the resonant frequencies of two surface acoustic wave resonators including dielectric films of the same thickness and electrode fingers of the same thickness, because the higher the resonant frequency is, the greater the number is.

The following describes a second preferred embodiment. The basic configuration in the second preferred embodiment is analogous to the configuration described above in relation to the first preferred embodiment, and the second preferred embodiment is described below with reference to the drawings mentioned above in relation to the first preferred embodiment.

The second preferred embodiment differs from the first preferred embodiment in that the second acoustic wave resonator 3B (see FIG. 3) is a series-arm resonator lower in resonant frequency than any other series-arm resonator of the second filter 1B. The composite filter device according to the second preferred embodiment is otherwise structurally identical to the composite filter device 10 according to the first preferred embodiment.

The second filter 1B is a ladder filter, the passband of which is dependent on the resonant frequencies of the series-arm resonators. The resonant frequencies of the series-arm resonators are within the passband of the filter. The anti-resonant frequencies of the series-arm resonators are on the high-frequency side relative to the passband. The lower the anti-resonant frequency of a series-arm resonator is, the closer the anti-resonant frequency of the series-arm resonator is to the passband. Thus, a series-arm resonator being lower in resonant frequency than any other series-arm resonator of the ladder filter and having a low anti-resonant frequency can heavily influence the steepness of the attenuation slope relevant to the filter characteristics. When there is little difference between the resonant frequency and the anti-resonant frequency of the series-arm resonator, the attenuation slope of the filter is steep in the vicinity of the high-frequency side of the passband.

The second preferred embodiment is similar to the first preferred embodiment in the following respects. The second acoustic wave resonator 3B and the wiring electrode 4 overlap each other when viewed in plan. This means that the electrostatic capacitance is provided to the second acoustic wave resonator 3B. Accordingly, the difference between the resonant frequency and the anti-resonant frequency of the second acoustic wave resonator 3B is reduced. This yields an increase in the steepness of attenuation in the vicinity of the boundary on the high-frequency side of the passband of the second filter 1B. The circuit configuration of the second filter 1B can be equated with a circuit in which capacitive portions are connected in parallel to the second acoustic wave resonator 3B, without the need for wiring dedicated to the capacitive portions. Accordingly, the steepness of the attenuation slope relevant to the filter characteristics can be increased without a decrease in the degree of flexibility in the layout of the resonators.

The second acoustic wave resonator 3B is preferably the lowest rank among the series-arm resonators of the second filter 1B in terms of the number that is the inverse of the result of multiplying the electrode finger pitch of the IDT electrode 15 by the metallization ratio. This feature more reliably ensures that the second acoustic wave resonator 3B is lower in resonant frequency than any other series-arm resonator of the second filter 1B.

The electrode finger pitch of the IDT electrode 15 is wider in the second acoustic wave resonator 3B than in any other series-arm resonator of the second filter 1B. This feature more reliably ensures that the second acoustic wave resonator 3B is lower in anti-resonant frequency than any other series-arm resonator of the second filter 1B.

It is preferred in a preferred embodiment of the present invention that the second acoustic wave resonator 3B be a parallel-arm resonator higher in resonant frequency than any other parallel-arm resonator of the second filter 1B or a series-arm resonator lower in resonant frequency than any other series-arm resonator of the second filter 1B, and the second acoustic wave resonator 3B and the wiring electrode 4 overlap each other when viewed in plan.

Figure 10:
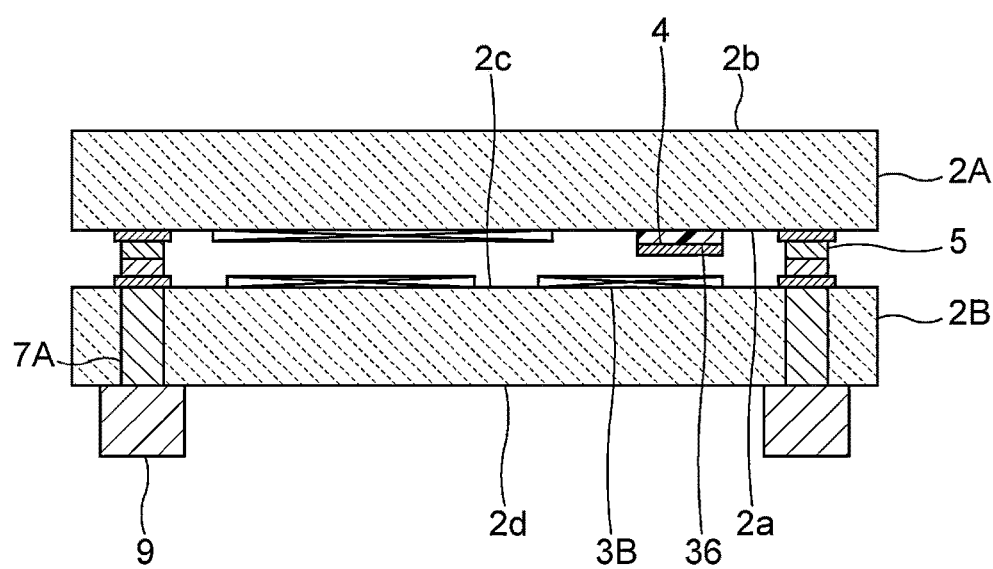
FIG. 10 is a sectional view of a composite filter device according to a third preferred embodiment of the present invention, schematically illustrating the composite filter device viewed from the front.

FIG. 10 is a sectional view of a composite filter device according to a third preferred embodiment, schematically illustrating the composite filter device viewed from the front.

The present preferred embodiment differs from the first preferred embodiment in that the first piezoelectric substrate 2A and the wiring electrode 4 are disposed with an insulating film 36 therebetween. The composite filter device according to the present preferred embodiment is otherwise structurally identical to the composite filter device 10 according to the first preferred embodiment.

Specifically, the insulating film 36 is disposed on the first main surface 2a of the first piezoelectric substrate 2A. The insulating film 36 is located in a space defined by the first main surface 2a of the first piezoelectric substrate 2A, the third main surface 2c of the second piezoelectric substrate 2B, and the support 5. The insulating film 36 in the present preferred embodiment does not extend over the acoustic wave resonators on the first piezoelectric substrate 2A. A portion of the wiring electrode 4 is located on the insulating film 36. The wiring electrode 4 and the second acoustic wave resonator 3B overlap each other on the insulating film 36 when viewed in plan. The distance between the second acoustic wave resonator 3B and the wiring electrode 4 is shortened accordingly.

The present preferred embodiment is similar to the first preferred embodiment in the following respect: the circuit configuration of the second filter can be equated with a circuit in which capacitive portions are connected in parallel to the second acoustic wave resonator 3B. The electrostatic capacitance of the capacitive portion can be effectively increased, owing to the shortening of the distance between the second acoustic wave resonator 3B and the wiring electrode 4. The capacitance provided to the second acoustic wave resonator 3B can be increased correspondingly in an effective manner. Accordingly, the steepness of the attenuation slope relevant to the filter characteristics can be effectively increased.

The wiring electrode 4 may be entirely disposed on the insulating film 36, but at least a portion of the wiring electrode 4 is located on the insulating film 36. The way the insulating film 36 is laid out is not limited. For example, the insulating film 36 may overlap the acoustic wave resonators on the first piezoelectric substrate 2A when viewed in plan. The insulating film 36 may be made of an appropriate inorganic insulating material or an appropriate resin.

The wiring electrode 4 is disposed on the first piezoelectric substrate 2A as illustrated in, for example, FIG. 1 and is hereinafter referred to as a first wiring electrode.

Figure 11:
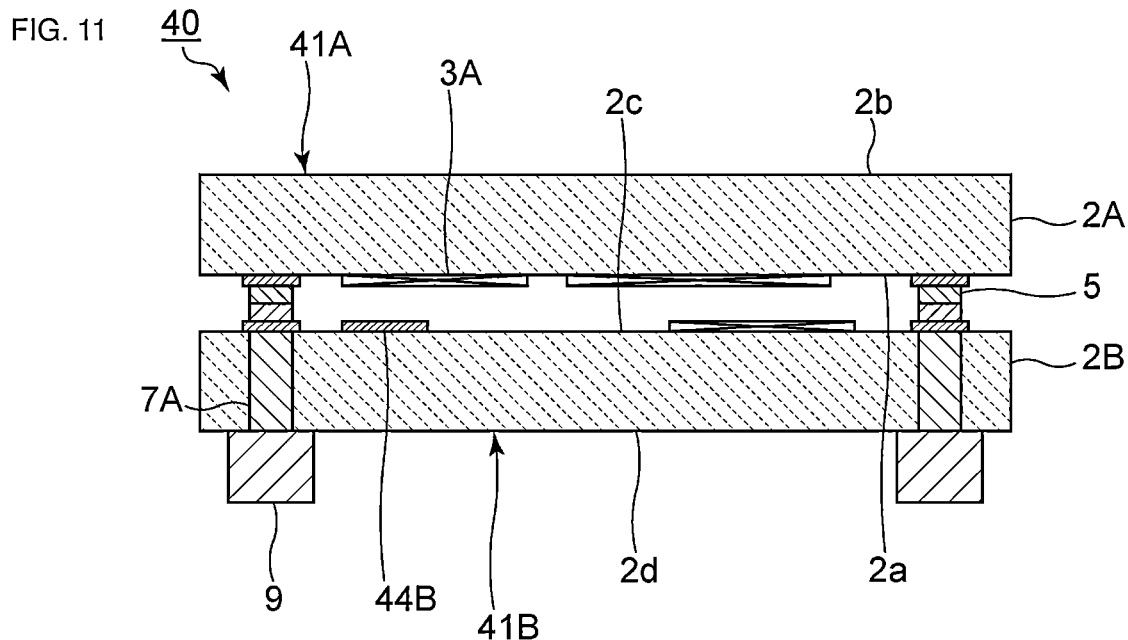
FIG. 11 is a sectional view of a composite filter device according to a fourth preferred embodiment of the present invention, schematically illustrating the composite filter device viewed from the front.
Figure 12:
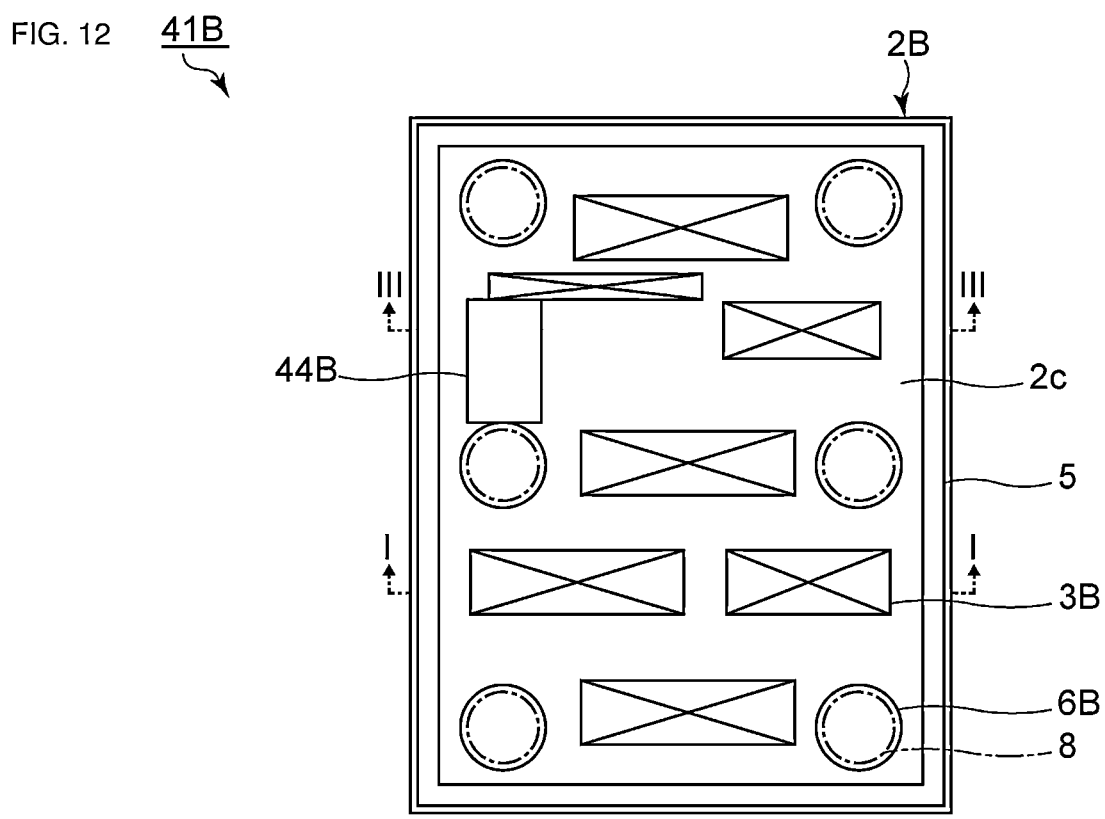
FIG. 12 is a plan view of the second piezoelectric substrate in the fourth preferred embodiment of the present invention, schematically illustrating the electrode configuration on the second piezoelectric substrate.
Figure 13:
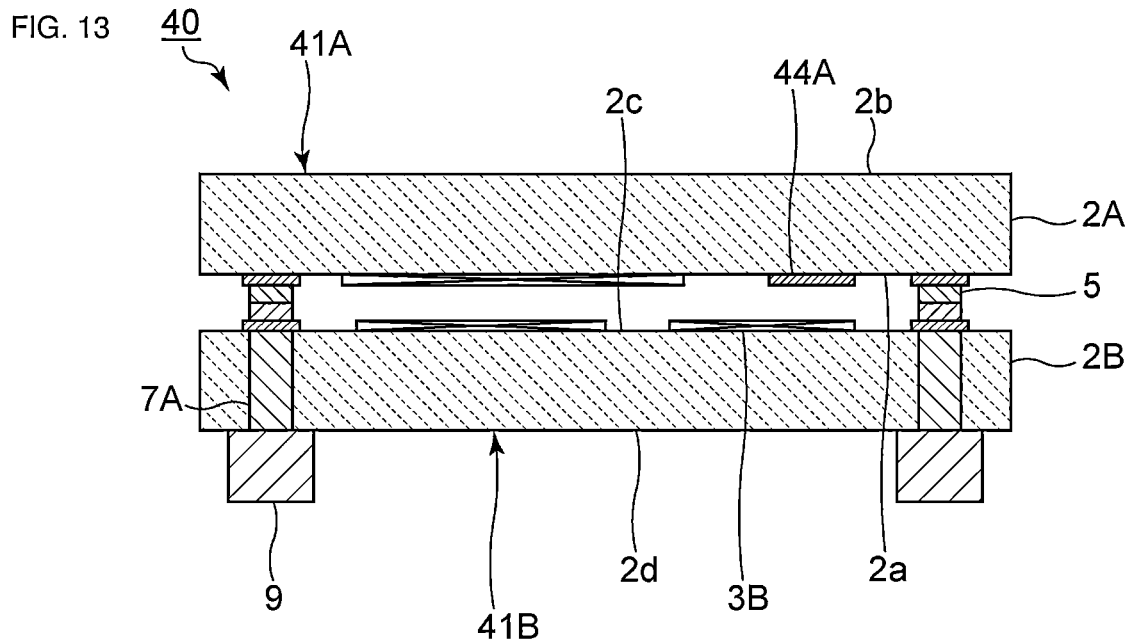
FIG. 13 is a schematic sectional view of the composite filter device taken along line I-I in FIG. 12.
Figure 14:
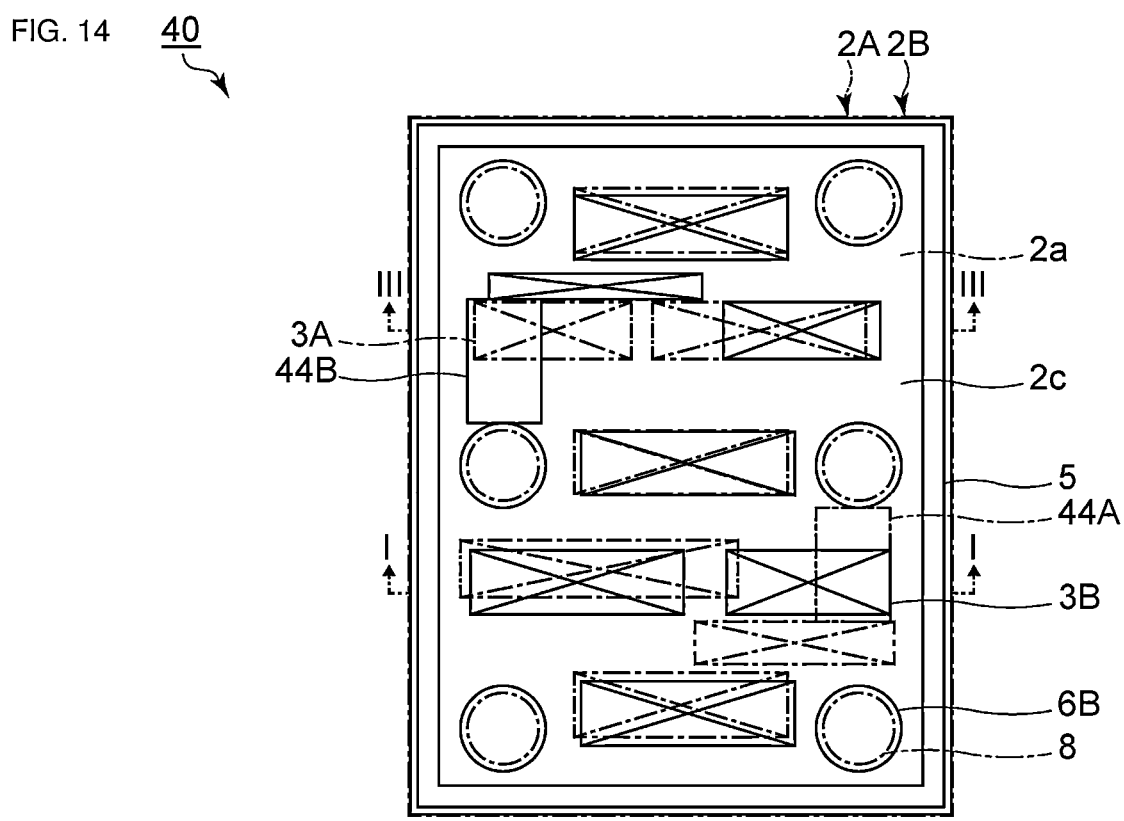
FIG. 14 is a plan perspective view of the first and second piezoelectric substrates in the fourth preferred embodiment of the present invention, schematically illustrating the electrode configuration on the first piezoelectric substrate and the electrode configuration on the second piezoelectric substrate.

FIG. 11 is a sectional view of a composite filter device according to a fourth preferred embodiment, schematically illustrating the composite filter device viewed from the front. FIG. 12 is a plan view of the second piezoelectric substrate in the fourth preferred embodiment, schematically illustrating the electrode configuration on the second piezoelectric substrate. FIG. 13 is a schematic sectional view of the composite filter device taken along line I-I in FIG. 12. FIG. 14 is a plan perspective view of the first and second piezoelectric substrates in the fourth preferred embodiment, schematically illustrating the electrode configuration on the first piezoelectric substrate and the electrode configuration on the second piezoelectric substrate. FIG. 11 is a schematic sectional view of the composite filter device taken along line III-III in FIG. 12.

Referring to FIG. 11, the composite filter device according to the present preferred embodiment is denoted by 40 and includes a first filter 41A and a second filter 41B. The present preferred embodiment differs from the first preferred embodiment in that the first acoustic wave resonator 3A is a parallel-arm resonator higher in resonant frequency than any other parallel-arm resonator of the first filter 41A. Another difference between the present preferred embodiment and the first preferred embodiment is in the wiring layout on the second piezoelectric substrate 2B (see FIG. 12). The composite filter device 40 according to the present preferred embodiment is otherwise structurally identical to the composite filter device 10 according to the first preferred embodiment.

Referring to FIG. 13, a first wiring electrode 44A is disposed on the first main surface 2a of the first piezoelectric substrate 2A of the first filter 41A. The wiring layout on the first filter 41A is identical to the wiring layout on the first filter 1A in the first preferred embodiment illustrated in FIG. 2. Thus, the first wiring electrode 44A (see FIG. 13) and the wiring electrode 4 in the first preferred embodiment are disposed in the same fashion. The first wiring electrode 44A overlaps the second acoustic wave resonator 3B when viewed in plan.

Referring to FIG. 12, a second wiring electrode 44B is disposed on the third main surface 2c of the second piezoelectric substrate 2B. The second wiring electrode 44B in the present preferred embodiment is connected to the reference potential. The second wiring electrode 44B may be a floating electrode.

As illustrated in FIG. 14, the second wiring electrode 44B overlaps the first acoustic wave resonator 3A when viewed in plan. The circuit configuration of the first filter 41A can thus be equated with a circuit in which capacitive portions are connected in parallel to the first acoustic wave resonator 3A. The difference between the resonant frequency and the anti-resonant frequency of the first acoustic wave resonator 3A in this circuit configuration is small. The first acoustic wave resonator 3A in the present preferred embodiment is a parallel-arm resonator higher in resonant frequency than any other parallel-arm resonator of the first filter 41A. This yields an increase in the steepness of attenuation in the vicinity of the boundary on the low-frequency side of the passband of the first filter 41A.

The second wiring electrode 44B may be used to connect the parallel-arm resonators of the second filter 41B to the reference potential. Thus, the circuit configuration of the first filter 41A in the present preferred embodiment can be equated with a circuit in which capacitive portions are connected in parallel to the first acoustic wave resonator 3A, without the need for wiring dedicated to the capacitive portions. Accordingly, the steepness of the attenuation slope relevant to the filter characteristics of the first filter 41A can be increased without a decrease in the degree of flexibility in the layout of the resonators.

Furthermore, the first wiring electrode 44A and the second acoustic wave resonator 3B overlap each other when viewed in plan. Accordingly, the steepness of the attenuation slope relevant to the filter characteristics of the second filter 41B can be increased without a decrease in the degree of flexibility in the layout of the resonators. This effect is analogous to what has been described above in relation to the first preferred embodiment. Thus, the present preferred embodiment is advantageous in that both the attenuation slope relevant to the filter characteristics of the first filter 41A and the attenuation slope relevant to the filter characteristics of the second filter 41B can be made steeper.

The first acoustic wave resonator 3A includes an IDT electrode. The IDT includes a pair of busbars, and both of the busbars preferably overlap the second wiring electrode 44B when viewed in plan. This layout reliably ensures that increased electrostatic capacitance is provided to the first acoustic wave resonator 3A. Accordingly, the steepness of the attenuation slope relevant to the filter characteristics can be increased with a high degree of reliability and effectiveness. This effect can be produced when the second wiring electrode 44B extends over at least part of the first acoustic wave resonator 3A viewed in plan.

The following describes a fifth preferred embodiment. The basic configuration in the fifth preferred embodiment is analogous to the configuration described above in relation to the fourth preferred embodiment, and the fifth preferred embodiment is described below with reference to the drawings mentioned above in relation to the fourth preferred embodiment.

The fifth preferred embodiment differs from the fourth preferred embodiment in that the second acoustic wave resonator 3B (see FIG. 12) is a series-arm resonator lower in resonant frequency than any other series-arm resonator of the second filter 41B. The composite filter device according to the fifth preferred embodiment is otherwise structurally identical to the composite filter device 40 according to the fourth preferred embodiment.

The second acoustic wave resonator 3B is a series-arm resonator lower in resonant frequency than any other series-arm resonator of the second filter 41B, in which case the anti-resonant frequency of the second acoustic wave resonator 3B is low. As mentioned above, a series-arm resonator with a lower anti-resonant frequency more heavily influences the steepness of attenuation in the vicinity of the boundary on the high-frequency side of the passband. The attenuation slope of the filter becomes especially steep when the resonant frequency of the series-arm resonator with such a low anti-resonant frequency is close to the anti-resonant frequency of the series-arm resonator.

The first acoustic wave resonator 3A and the second wiring electrode 44B overlap each other when viewed in plan (see FIG. 11). The circuit configuration of the first filter 41A can thus be equated with a circuit in which capacitive portions are connected in parallel to the first acoustic wave resonator 3A. Accordingly, the difference between the resonant frequency and the anti-resonant frequency of the first acoustic wave resonator 3A is reduced. This yields an increase in the steepness of attenuation in the vicinity of the boundary on the high-frequency side of the passband of the first filter 41A. The circuit configuration of the first filter 41A can be equated with a circuit in which capacitive portions are connected in parallel to the first acoustic wave resonator 3A, without the need for wiring dedicated to the capacitive portions. Accordingly, the steepness of the attenuation slope relevant to the filter characteristics can be increased without a decrease in the degree of flexibility in the layout of the resonators.

Furthermore, the first wiring electrode 44A and the second acoustic wave resonator 3B overlap each other when viewed in plan (see FIG. 13). Accordingly, the steepness of the attenuation slope relevant to the filter characteristics of the second filter 41B can be increased without a decrease in the degree of flexibility in the layout of the resonators. This effect is analogous to what has been described above in relation to the fourth preferred embodiment.

It is preferred that the first acoustic wave resonator 3A be a parallel-arm resonator higher in resonant frequency than any other parallel-arm resonator of the first filter 41A or a series-arm resonator lower in resonant frequency than any other series-arm resonator of the first filter 41A. Thus, the attenuation slope relevant to the filter characteristics of the first filter 41A as well as the attenuation slope relevant to the filter characteristics of the second filter 41B can be made steeper. This effect is analogous to what has been described above in relation to the fourth preferred embodiment and the fifth preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device comprising:
a first filter and a second filter each including at least one series-arm resonator and at least one parallel-arm resonator;
a first piezoelectric substrate including a first main surface and a second main surface on opposite sides;
a first acoustic wave resonator including a functional electrode on the first main surface of the first piezoelectric substrate, the first acoustic wave resonator being included in the first filter;
a wiring electrode on the first main surface of the first piezoelectric substrate, the wiring electrode not being connected to a signal potential;
a support on the first main surface of the first piezoelectric substrate and surrounding the first acoustic wave resonator;
a second piezoelectric substrate on the support and including a third main surface and a fourth main surface on opposite sides, the third main surface being closer to the support than the fourth main surface; and
a second acoustic wave resonator including a functional electrode on the third main surface of the second piezoelectric substrate, the second acoustic wave resonator being included in the second filter; wherein
the first acoustic wave resonator and the second acoustic wave resonator are located in a space defined by the first main surface of the first piezoelectric substrate, the third main surface of the second piezoelectric substrate, and the support;
the second acoustic wave resonator is a parallel-arm resonator higher in resonant frequency than any other parallel-arm resonator of the second filter or a series-arm resonator lower in resonant frequency than any other series-arm resonator of the second filter; and
the second acoustic wave resonator and the wiring electrode overlap each other when viewed in plan.

2. The composite filter device according to claim 1, wherein the second acoustic wave resonator is a parallel-arm resonator higher in resonant frequency than any other parallel-arm resonator of the second filter.

3. The composite filter device according to claim 1, wherein the second acoustic wave resonator is a series-arm resonator lower in resonant frequency than any other series-arm resonator of the second filter.

4. The composite filter device according to claim 2, wherein the wiring electrode is connected to a reference potential.

5. The composite filter device according to claim 2, wherein the wiring electrode is connected to neither a reference potential nor a signal potential.

6. The composite filter device according to claim 2, wherein
the functional electrode of the second acoustic wave resonator is an interdigital transducer electrode including a pair of busbars and a plurality of electrode fingers; and
the wiring electrode overlaps both of the busbars when viewed in plan.

7. The composite filter device according to claim 2, further comprising an insulating film on the first main surface of the first piezoelectric substrate; wherein at least a portion of the wiring electrode is located on the insulating film; and
the wiring electrode and the second acoustic wave resonator overlap each other on the insulating film when viewed in plan.

8. The composite filter device according to claim 2, wherein
the wiring electrode is a first wiring electrode;
the composite filter device further comprises a second wiring electrode on the third main surface of the second piezoelectric substrate and not being connected to signal potential;
the first acoustic wave resonator is a parallel-arm resonator higher in resonant frequency than any other parallel-arm resonator of the first filter or a series-arm resonator lower in resonant frequency than any other series-arm resonator of the first filter; and
the first acoustic wave resonator and the second wiring electrode overlap each other when viewed in plan.

9. The composite filter device according to claim 8, wherein the first acoustic wave resonator is a parallel-arm resonator higher in resonant frequency than any other parallel-arm resonator of the first filter.

10. The composite filter device according to claim 8, wherein the first acoustic wave resonator is a series-arm resonator lower in resonant frequency than any other series-arm resonator of the first filter.

11. The composite filter device according to claim 1, wherein each of the first and second piezoelectric substrates is made of piezoelectric material only.

12. The composite filter device according to claim 1, wherein each of the first and second piezoelectric substrates is a multilayer substrate including a plurality of piezoelectric layers.

13. The composite filter device according to claim 1, wherein the wiring electrode is connected to one of the parallel-arm resonators.

14. The composite filter device according to claim 1, wherein the support has a frame structure or includes columnar supports on the first main surface.

15. The composite filter device according to claim 1, wherein the second filter is a ladder filter.

16. The composite filter device according to claim 1, wherein capacitive coupling is provided between the second acoustic wave resonator and the wiring electrode.

17. The composite filter device according to claim 6, wherein reflectors are provided on both sides of the plurality of electrode fingers.

18. The composite filter device according to claim 1, wherein one or more of the acoustic wave resonators of the first filter or one or more of the acoustic wave resonators of the second filter are electrically connected to outside via the support or through-via electrodes or bumps.

19. The composite filter device according to claim 1, wherein one or more of the acoustic wave resonators of the first filter or one or more of the acoustic wave resonators of the second filter are electrically connected to outside via columnar bodies or through-via electrodes or bumps.

20. The composite filter device according to claim 1, wherein the first filter and the second filter each include a longitudinally coupled resonator acoustic wave filter.

* * * * *